(12) United States Patent
Bhattacharya et al.

(10) Patent No.: US 8,451,604 B2
(45) Date of Patent: May 28, 2013

(54) CHIMNEY-BASED COOLING MECHANISM FOR COMPUTING DEVICES

(75) Inventors: Anandaroop Bhattacharya, Karnataka (IN); Mark MacDonald, Beaverton, OR (US); Sanjay Vijayaraghavan, Karnataka (IN)

(73) Assignee: Intel Corporation, Santa Clara, CA (US)

( * ) Notice: Subject to any disclaimer, the term of this patent is extended or adjusted under 35 U.S.C. 154(b) by 224 days.

(21) Appl. No.: 12/976,904

(22) Filed: Dec. 22, 2010

(65) Prior Publication Data

US 2012/0073789 A1 Mar. 29, 2012

(51) Int. Cl.
*H05K 7/20* (2006.01)

(52) U.S. Cl.
USPC .............................. 361/690; 361/694; 361/695

(58) Field of Classification Search
USPC .......................................................... 361/690
See application file for complete search history.

(56) References Cited

U.S. PATENT DOCUMENTS

| | | | | |
|---|---|---|---|---|
| 3,247,896 A * | 4/1966 | Chu et al. | ...................... | 165/80.3 |
| 3,780,798 A * | 12/1973 | Reimer | ......................... | 165/128 |
| 3,940,665 A * | 2/1976 | Seki | .............................. | 361/692 |
| 5,089,935 A * | 2/1992 | Ito | ................................. | 361/692 |
| 5,513,071 A * | 4/1996 | LaViolette et al. | ........... | 361/703 |
| 5,613,906 A | 3/1997 | Kikinis | | |
| 6,459,577 B1 * | 10/2002 | Holmes et al. | ................ | 361/690 |
| 6,538,814 B2 * | 3/2003 | Hunter et al. | ................. | 359/449 |
| 7,355,848 B1 * | 4/2008 | Hodge et al. | .................. | 361/690 |
| 8,154,869 B2 * | 4/2012 | Riebel | ............................. | 361/694 |
| 2002/0080577 A1 | 6/2002 | Babcock et al. | | |
| 2003/0117772 A1 * | 6/2003 | Searls et al. | .................. | 361/690 |
| 2004/0201957 A1 | 10/2004 | Wu et al. | | |
| 2006/0238980 A1 | 10/2006 | Bhattacharyya et al. | | |
| 2007/0206357 A1 * | 9/2007 | Hellinger et al. | ............. | 361/709 |
| 2009/0116186 A1 * | 5/2009 | Wei et al. | ....................... | 361/690 |
| 2012/0162918 A1 * | 6/2012 | Thyni et al. | ................... | 361/698 |

OTHER PUBLICATIONS

"PCT International Search Report and Written Opinion", Mailing date Mar. 21, 2012, 9 pages.

\* cited by examiner

*Primary Examiner* — Gregory Thompson
(74) *Attorney, Agent, or Firm* — Blakely, Sokoloff, Taylor & Zafman LLP

(57) ABSTRACT

A mechanism is described for chimney-based cooling of computer components. A method of embodiments of the invention includes determining heat-emitting components of a computing device. The method further includes coupling a chimney to one or more of the heat-emitting components such that chimney effect of the chimney is used to guide air associated with a component in and out of the chimney.

18 Claims, 7 Drawing Sheets

CHIMNEY-BASED COOLING MECHANISM FOR COMPUTING DEVICES

RELATED APPLICATION

This application claims priority to an Indian Patent Application Number 2309/DEL/2010, entitled CHIMNEY-BASED COOLING MECHANISM FOR COMPUTING DEVICES, filed on Sep. 27, 2010.

FIELD

The field relates generally to cooling solutions for electronic devices and, more particularly, to employing chimney-based cooling mechanism for computing devices.

BACKGROUND

Today, there exist various solutions for cooling computers. However, these solutions for cooling computers (e.g., All-In-One (AIO) desktop computers) include fans or blowers. For example, a typical AIO computer is cooled by one or more blower fans that entrain cool air from the ambient, which in turn flows over the hot components of the computer, or their associated heat exchangers, to cool them down. This results in a high acoustic penalty and also higher power draw from the power supply to which the computer is connected. Further, since an AIO computer packs all its electronics behind or under the screen, the problem of high fan acoustic noise is further exacerbated.

BRIEF DESCRIPTION OF THE DRAWINGS

Embodiments of the present invention are illustrated by way of example and not by way of limitation in the figures of the accompanying drawings, in which like references indicate similar elements and in which.

DETAILED DESCRIPTION

Embodiments of the invention provide a mechanism for chimney-based cooling of computer components. A method of embodiments of the invention includes determining heat-emitting components of a computing device. The method further includes coupling a chimney to one or more of the heat-emitting components such that chimney effect of the chimney is used to guide air associated with a component in and out of the chimney.

In one embodiment, chimneys are employed in computers for cooling purposes such that it eliminates the need for employing fans or blowers, which further results in the elimination of fan acoustic noise and a significant reduction in power consumption associated with fans and blowers. Chimney effect (or stack effect) is a well-known phenomenon and refers to the buoyancy-driven movement of air into and out of homes, buildings, etc. Chimney effect is responsible for amplifying the air movement associated with natural convection and is frequently used for ventilations in homes, certain heat-producing appliances, etc. Buoyancy results from the difference of air density that is due to temperature differences, moisture differences, etc. Typically, the greater the thermal difference and the height of the structure, the greater the buoyancy force and the chimney effect. In one embodiment, this chimney or stack effect is used and leveraged such that the heated air from various components within the computer rises up through a ducted passage due to its density being different (i.e., lower) compared to the surrounding air or gas. This helps maximize the airflow by natural draft and increases effectiveness of dissipating the heat generated within the system It is contemplated that this technique can work with any number of electronic devices, including all types and forms of computer systems; however, for brevity, clarity, and ease of understanding, AIO computer is mentioned as an example throughout this document.

Figure 1:
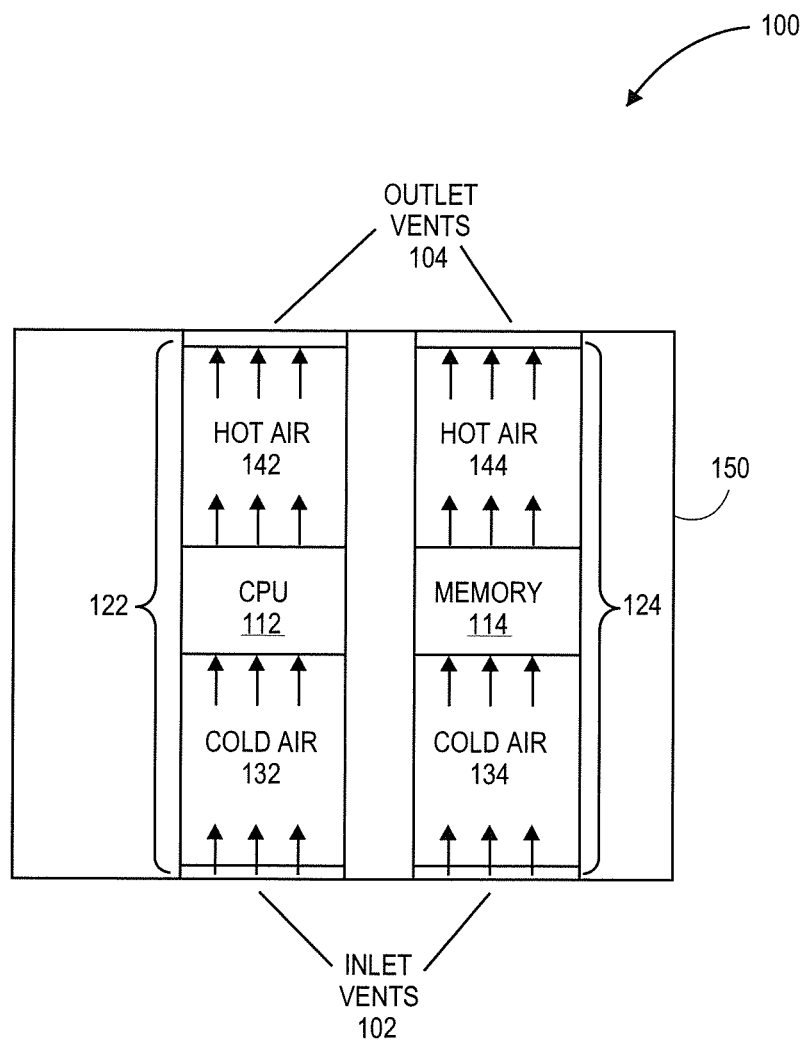
FIG. 1 illustrates a chimney-based cooling mechanism according to one embodiment of the invention.

FIG. 1 illustrates a chimney-based cooling mechanism 100 according to one embodiment of the invention. The illustrated embodiment shows a motherboard 150 of a computer system having any number of heat-emitting components. For brevity, simplicity and ease of understanding, a central processing unit (CPU) 112 and memory 114 of an AIO computer's motherboard 150 are shown. In one embodiment, a single chimney 122 and 124 is placed over CPU 112 and memory 114, respectively. In one embodiment, as illustrated, the chimneys 122, 124 inhale or receive cold air 132, 134 through their inlet vents 102 and exhale or emit hot air 142, 144 (produced by the CPU 112, memory 114) through their outlet vents 104. This movement of air is achieved through the chimney effect or stack effect of the two chimneys 112, 114.

As will be discussed with respect to FIGS. 2A-2C, the chimneys 122, 124 may be made of any material ranging from metal to plastic (as deemed appropriate and necessary) and can be made to have thermal contact with their corresponding components 112, 114 by establishing direct contact with the components 112, 114 or through their spreaders or heat exchangers (HXs) or in some other similar manner. For brevity, HX is used here as an example. In one embodiment, the chimney effect drives the air movement of the cold and hot air 132, 134, 142, 144 inside the chimneys 122, 124 with ease, discipline, and efficiency without the need to install any conventional fans or blowers. Further, a single chimney may be used for one or more components. For example, for a high heat producing component, like the CPU 112, the illustrated single large chimney 122 may be appropriate; however, for low heat producing smaller or less-often used components, a single chimney may be sufficient for any number of such components.

Figure 2A:
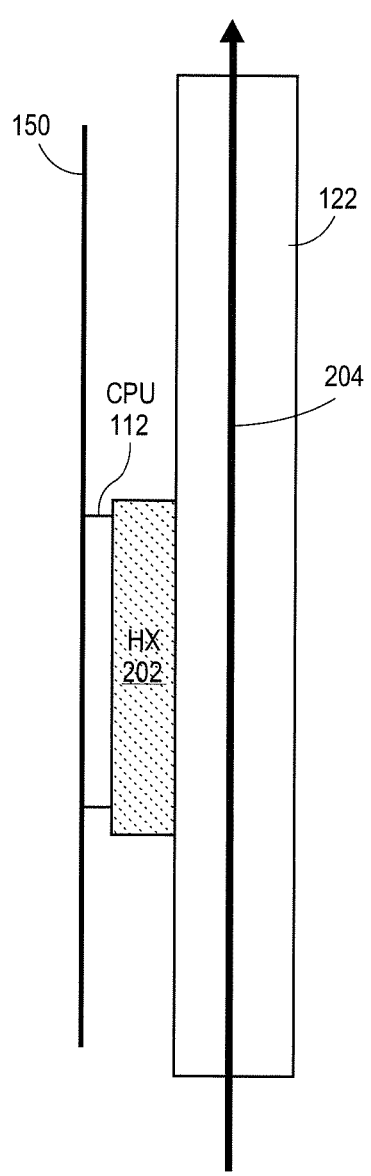
FIGS. 2A-2C illustrate side views of the chimney-based cooling mechanism of FIG. 1 according to one embodiment of the invention.
Figure 2B:
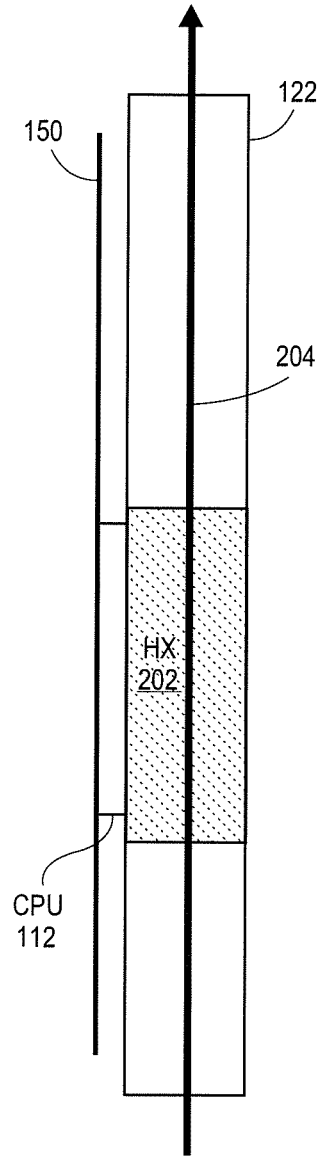
Figure 2C:
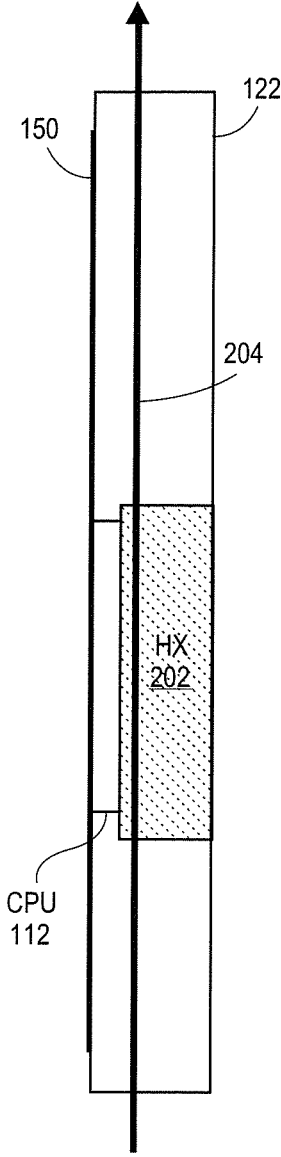

FIGS. 2A-2C illustrate side views of the chimney-based cooling mechanism 100 of FIG. 1 according to one embodiment of the invention. Again, for brevity and simplicity, only the CPU 112 of FIG. 1 is used for illustrating the side views. In FIG. 2A, the motherboard 150 is shown to have the CPU 112 attached to a heat exchanger 202. A HX refers to a device that is used for efficient heat transfer from one medium to another. In one embodiment, the chimney or duct 122 is directly coupled to the HX 202 such that an intimate thermal connection (e.g., through solder, thermal grease, etc.) is maintained with the HX 202. As aforementioned, the chimney may be made of any type of material, but given its connectivity with the HX 202, in this particular case, metal may be the preferred material (although other materials, such as plastic, would also work, but with decreased efficiency). In one embodiment, the chimney 122, using the chimney effect, moves the air 204 (e.g., including cold and hot air 132, 142 of FIG. 1) from its inlet vents to the outlet vents without the need for conventional fans or blowers.

FIG. 2B illustrates the chimney 122 having encompassed the HX 202. As illustrated, the HX 202 and the chimney 122 are seamlessly merged together, i.e., no gap or leakage is yielded between the outside walls of the HX 202 and the inside walls of the chimney 122, which provides maximum efficiency in the movement of the air 204. In this embodiment, the chimney 122 is directly connected to the CPU 112. Referring to FIG. 2C, the chimney 122 is directly connected to the motherboard 150 and seamlessly encompasses both the CPU 112 and the HX 202 without yielding any gaps or leakages between the chimney 122, the HX 202, and the CPU 112. The chimney 112 of FIGS. 2B and 2C may be made of metal or plastic or the like.

Figure 3:
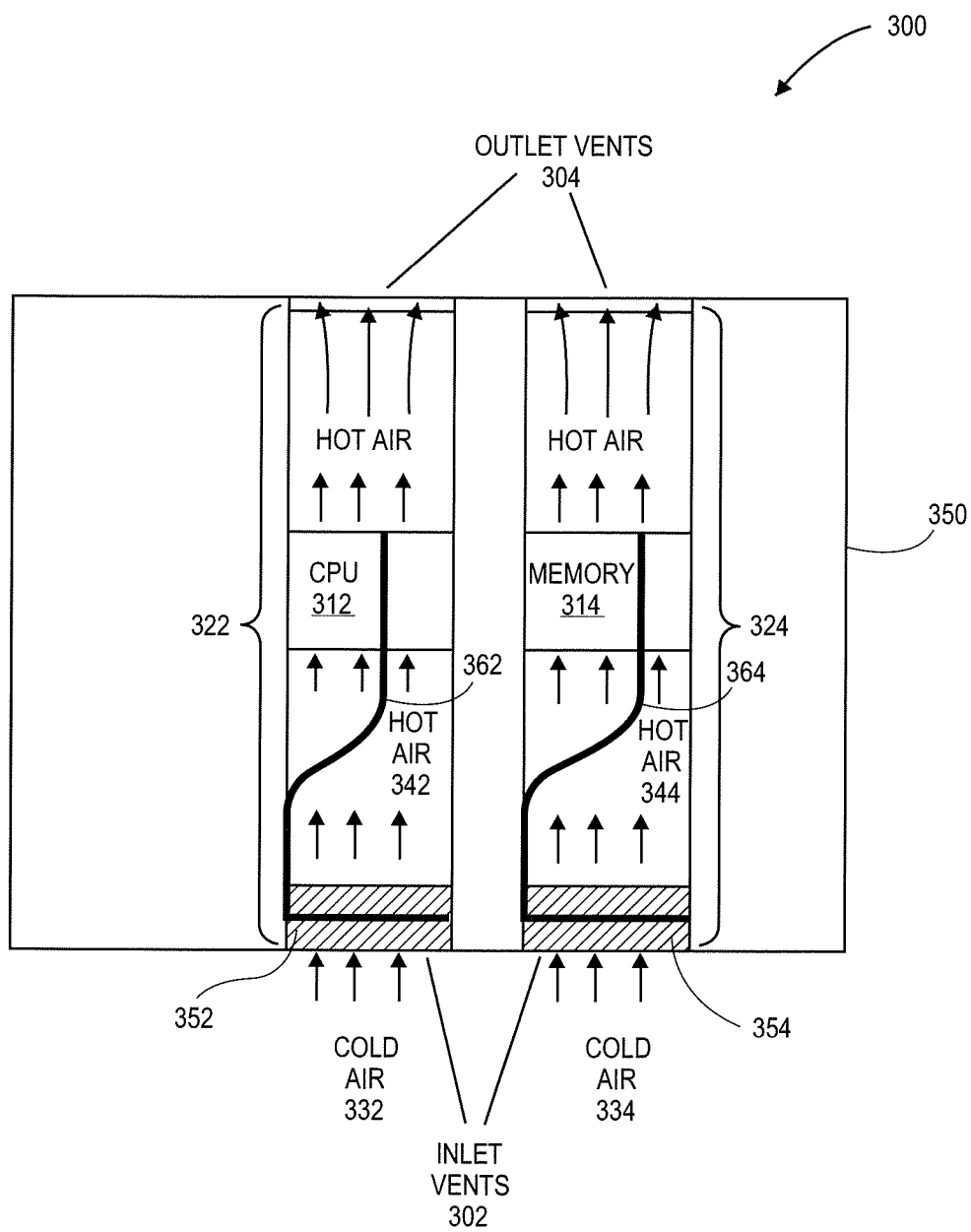
FIG. 3 illustrates a chimney-based cooling mechanism according to one embodiment of the invention.

FIG. 3 illustrates a chimney-based cooling mechanism 300 according to one embodiment of the invention. As with FIG. 1, the illustrated embodiment shows a motherboard 350 of a computer system having any number of heat-emitting components. Again, for brevity and simplicity, CPU 312 and memory 314 of an AIO computer's motherboard 350 are shown. In one embodiment, a single chimney 322 and 324 is placed over CPU 312 and memory 314, respectively. In one embodiment, as illustrated, the chimneys 322, 324 inhale or receive cold air 332, 334 through their inlet vents 302 and exhale or emit hot air 342, 344 (produced by the CPU 312, memory 314) through their outlet vents 304. This movement of air is performed due to the chimney effect or stack effect of the two chimneys 312, 314.

In one embodiment, HXs corresponding to the CPU 312 and memory 314 are remote HXs (RHXs) 352, 354. In other words, these RHXs 352, 354 are not attached to their corresponding components CPU 312 and memory 314; rather, they are remotely located near the bottom or one side of the motherboard 350 and are at the end of their respective chimneys 322, 324. Heat pipes 362, 364 connect the RHXs 352, 354 with the corresponding components 312, 314. A heat pipe 362, 364 represents a heat transfer mechanism that transfers heat between two or more solid interfaces, such as the RHXs 352, 354 and CPU 312 and memory 314. Since the cold air 332, 334 is typically without consequences and it is the hot air 342, 344 that matters and requires movement, in one embodiment, having the RHXs 352, 354 near the bottom of the chimneys 322, 324 provides greater space for the hot air 342, 344 to efficiently move about the chimney and out the outlet vents 304. In one embodiment, a RHX 352, 354 is placed at the base of the chimney 122, 124 for maximum cooling performance. Further, RHXs 352, 354 are not necessarily collated with the heat source. The terminal connection with the RHX 352, 354 and the corresponding heat-emitting component 312, 314 is through a heat pipe 362, 364, as illustrated, but it could be any number of other heat transport devices, such as a pumped loop, a looped heat pipe, a thermosyphon, or even a piece of high thermal conductivity material.

As will be discussed with respect to FIGS. 4A-4C, the chimneys 322, 324 may be made of any material ranging from metal to plastic (as deemed appropriate and necessary) and can be made to have thermal contact with their corresponding components 312, 314 by establishing direct contact with the components 312, 314 or through their RHXs 352, 354 or in some other similar manner. In one embodiment, the chimney effect drives the air movement of the cold and hot air 332, 334, 342, 344 from the inlet vents 302 to the outlet vents 304 of the chimneys 122, 124 with ease and efficiency without having the need to install any conventional fans or blowers. Further, a single chimney may be used for one or more components. For example, for a high heat producing component, like the CPU 312, the illustrated single large chimney 322 may be appropriate; however, for low heat producing smaller or less-often used components, a single chimney may be sufficient for any number of such components.

Figures 4A, 4B, 4C:
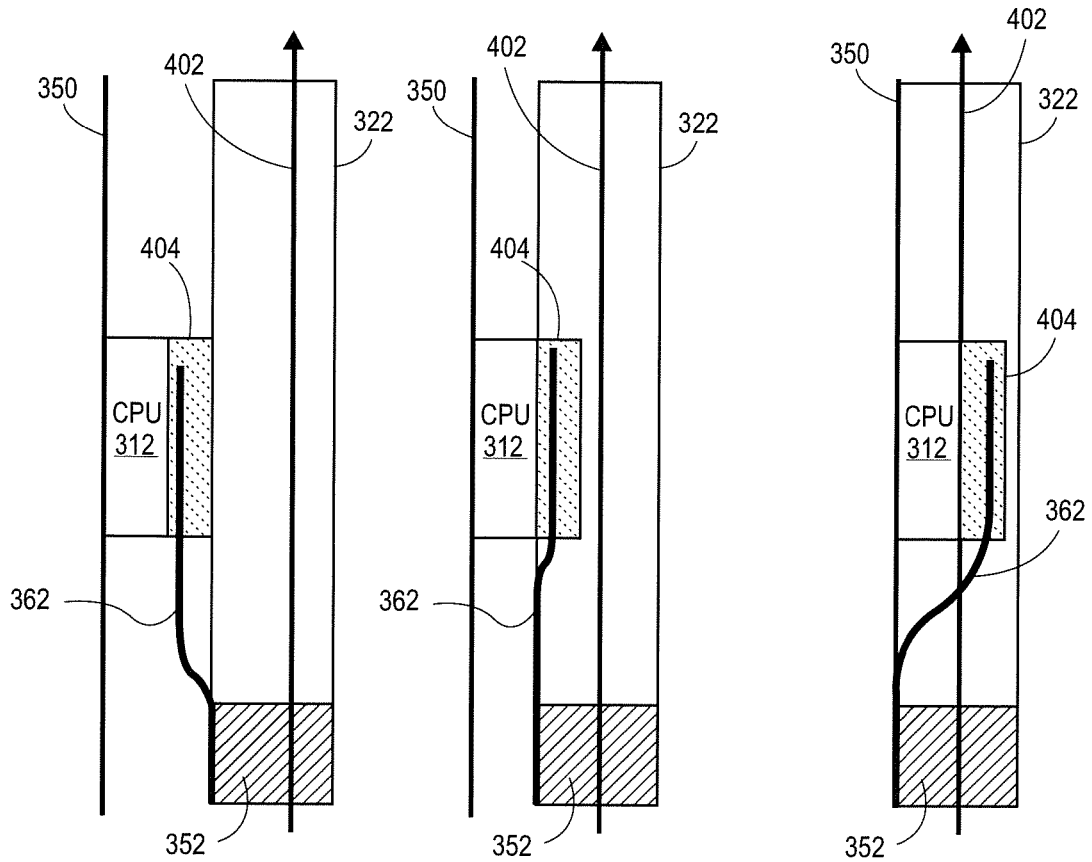
FIGS. 4A-4C illustrate side views of the chimney-based cooling mechanism 300 of FIG. 3 according to one embodiment of the invention.

FIGS. 4A-4C illustrate side views of the chimney-based cooling mechanism 300 according to one embodiment of the invention. Again, for brevity and simplicity, only the CPU 312 of FIG. 3 is used for illustrating the side views. In FIG. 4A, the motherboard 350 is shown to have the CPU 312 attached to chimney 322 via a CPU die 404. In the illustrated embodiment, RHX 352 is remotely located and connected to the CPU through a heat pipe 362. Further, the RHX 352 is located at the bottom of the chimney 322, leaving the majority of the chimney for managing and moving the hot air 402 out through the outlet vents of the chimney 322. In one embodiment, the chimney 322 is directly coupled to the RHX 352 and the CPU die 404 (through the die 404) and maintains an intimate thermal connection with the RHX 352 and the CPU 312. As aforementioned, the chimney may be made of any type of material ranging from plastic to metal. In one embodiment, the chimney 322, using the chimney effect, moves the air 402 (e.g., including cold and hot air 332, 342 of FIG. 3) from its inlet vents to the outlet vents without the need for conventional fans or blowers.

FIG. 4B illustrates the chimney 322 having encompassed the CPU die 404 and is directly connected to the CPU 312. Referring to FIG. 4C, the chimney 322 is directly connected to the motherboard 350 and seamlessly encompasses the CPU 312, the CPU die 404, and the RHX 352 without yielding any gaps or leakages between the chimney 322, the RHX 352, the CPU 312, and the CPU die 404. The chimney 322 of FIGS. 4B and 4C may be made of metal or plastic or the like.

Figure 5:
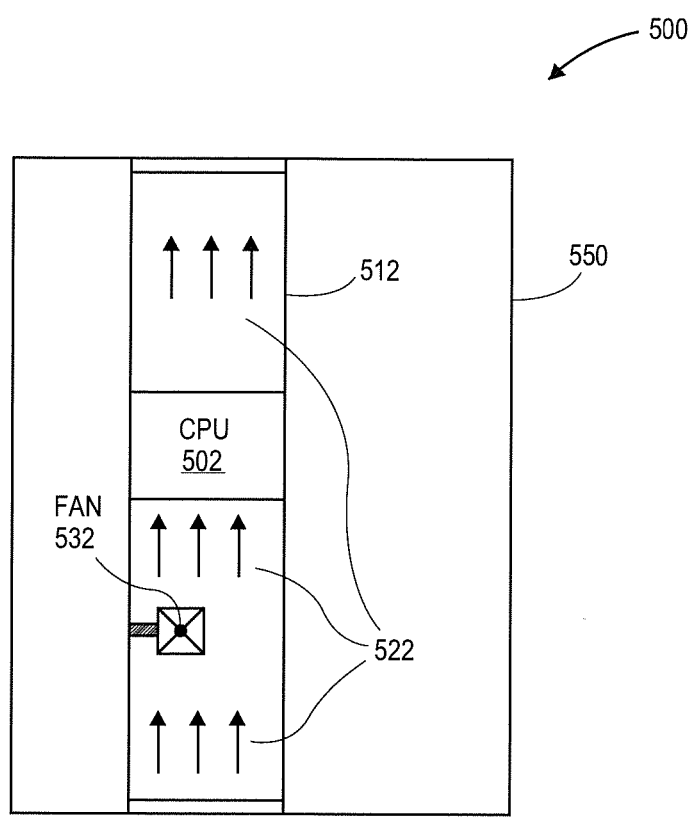
FIG. 5 illustrates a chimney-based cooling mechanism employing a fan according to one embodiment of the invention.

FIG. 5 illustrates a chimney-based cooling mechanism 500 employing a fan 532 according to one embodiment of the invention. In the illustrated embodiment, a chimney or duct 512 is employed over CPU 502 located on a motherboard 550 to move about the cold and hot air 522. In one embodiment, a fan 532 (e.g., a miniature fan or a fan-like air mover, such as a synthetic jet, piezo flapper, ionic wind, etc.) may be employed to couple its effect with the chimney effect for an even more efficient movement of the air 522. For example, in certain scenarios, the entrained air may not be able to maintain the component junction or case temperatures below their prescribed limits and thus, in such cases, the impact of the chimney 512 may be augmented by the presence of a small traditional air mover like a small fan or alternate non-traditional air moving technologies such as ones mentioned above.

Figure 6:
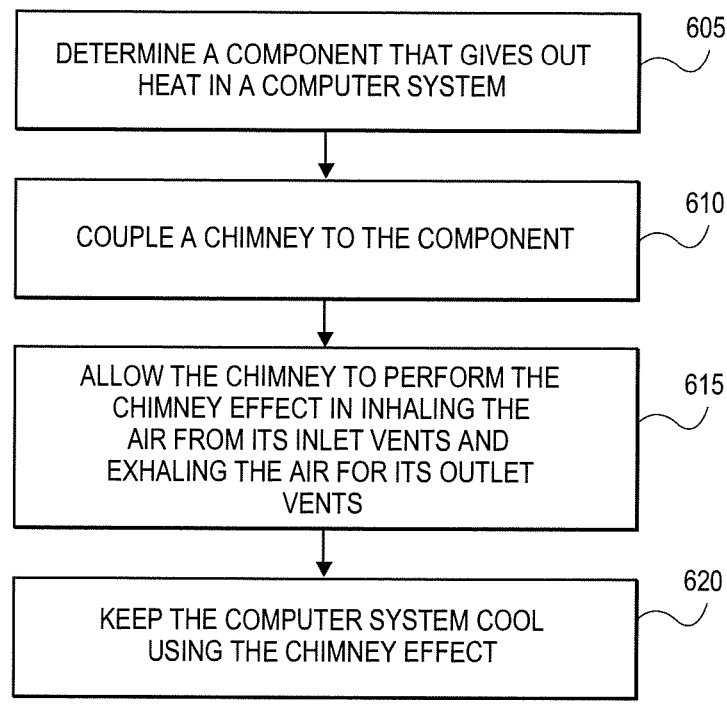
FIG. 6 illustrates a process for chimney-based cooling of computer components according to one embodiment of the invention.

FIG. 6 illustrates a process for chimney-based cooling of computer components according to one embodiment of the invention. At block 605, heat- or hot air-emitting components on a motherboard in a computer system are detected. At block 610, in one embodiment, a chimney is coupled to each component of the motherboard. In one embodiment, a single chimney is coupled to each component or, in another embodiment, a single chimney is coupled to cover two or more components. For example, a single chimney may be required for a high heat-emitting component, while a single chimney may be equally sufficient for two or more low heat-emitting components.

At block 615, the chimney is allowed to perform its chimney effect in terms of inhaling or receiving cold air from its inlet vents and exhaling or emitting hot air out from its outlet vents. At block 620, the heat- or hot air-emitting components on the motherboard of the computer system are kept cool using the chimneys and their chimney effect.

Figure 7:
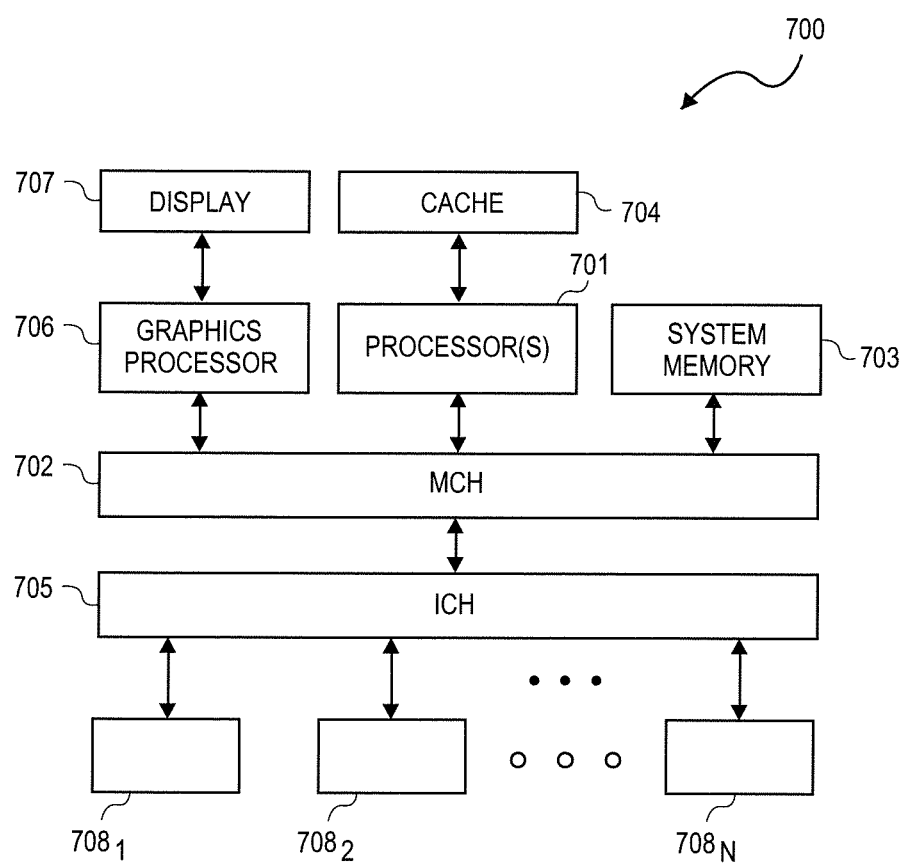
FIG. 7 illustrates a computing system capable of employing a chimney-based cooling mechanism.

FIG. 7 illustrates a computing system 700 capable of employing a chimney-based cooling mechanism. The exemplary computing system of FIG. 7 includes: 1) one or more processor 701 at least one of which may include features described above; 2) a memory control hub (MCH) 702; 3) a system memory 703 (of which different types exist such as double data rate RAM (DDR RAM), extended data output RAM (EDO RAM) etc.); 4) a cache 704; 5) an input/output (I/O) control hub (ICH) 705; 6) a graphics processor 706; 7) a display/screen 707 (of which different types exist such as Cathode Ray Tube (CRT), Thin Film Transistor (TFT), Liquid Crystal Display (LCD), DPL, etc.; and 8) one or more I/O devices 708.

The one or more processors 701 execute instructions in order to perform whatever software routines the computing system implements. The instructions frequently involve some sort of operation performed upon data. Both data and instructions are stored in system memory 703 and cache 704. Cache 704 is typically designed to have shorter latency times than system memory 703. For example, cache 704 might be integrated onto the same silicon chip(s) as the processor(s) and/or constructed with faster static RAM (SRAM) cells whilst system memory 703 might be constructed with slower dynamic RAM (DRAM) cells. By tending to store more frequently used instructions and data in the cache 704 as opposed to the system memory 703, the overall performance efficiency of the computing system improves.

System memory 703 is deliberately made available to other components within the computing system. For example, the data received from various interfaces to the computing system (e.g., keyboard and mouse, printer port, Local Area Network (LAN) port, modem port, etc.) or retrieved from an internal storage element of the computer system (e.g., hard disk drive) are often temporarily queued into system memory 703 prior to their being operated upon by the one or more processor(s) 701 in the implementation of a software program. Similarly, data that a software program determines should be sent from the computing system to an outside entity through one of the computing system interfaces, or stored into an internal storage element, is often temporarily queued in system memory 703 prior to its being transmitted or stored.

The ICH 705 is responsible for ensuring that such data is properly passed between the system memory 703 and its appropriate corresponding computing system interface (and internal storage device if the computing system is so designed). The MCH 702 is responsible for managing the various contending requests for system memory 703 access amongst the processor(s) 701, interfaces and internal storage elements that may proximately arise in time with respect to one another.

One or more I/O devices $708_1$, $708_2$-$708_N$ are also implemented in a typical computing system. I/O devices $708_1$, $708_2$-$708_N$ generally are responsible for transferring data to and/or from the computing system (e.g., a networking adapter); or, for large scale non-volatile storage within the computing system (e.g., hard disk drive). ICH 705 has bi-directional point-to-point links between itself and the observed I/O devices $708_1$, $708_2$-$708_N$.

Portions of various embodiments of the present invention may be provided as a computer program product, which may include a computer-readable medium having stored thereon computer program instructions, which may be used to program a computer (or other electronic devices) to perform a process according to the embodiments of the present invention. The machine-readable medium may include, but is not limited to, floppy diskettes, optical disks, compact disk read-only memory (CD-ROM), and magneto-optical disks, ROM, RAM, erasable programmable read-only memory (EPROM), electrically EPROM (EEPROM), magnet or optical cards, flash memory, or other type of media/machine-readable medium suitable for storing electronic instructions.

In the foregoing specification, the invention has been described with reference to specific exemplary embodiments thereof. It will, however, be evident that various modifications and changes may be made thereto without departing from the broader spirit and scope of the invention as set forth in the appended claims. The Specification and drawings are, accordingly, to be regarded in an illustrative rather than a restrictive sense.

We claim:

1. A method comprising:
   determining a heat-emitting component of a computing device; and
   coupling a chimney to the component such that the chimney is used to guide an amount of air associated with the component in and out of the chimney; and
   associating a heat exchange mechanism to the component to facilitate sufficient air space to efficiently move about the amount of air within the chimney in accordance with characteristics of the component.

2. The method of claim 1, wherein guiding the amount air includes removing hot air associated with the component out of the chimney using chimney effect.

3. The method of claim 1, wherein the chimney is directly or indirectly coupled to the component.

4. The method of claim 1, wherein the component comprises one or more of a processor, a memory, a battery, and a connector.

5. The method of claim 1, wherein the heat exchange mechanism is associated with the component via a heat transportation device, wherein the heat transportation device includes a heat pipe running, via the chimney, from the heat exchange mechanism to the component.

6. The method of claim 5, wherein the heat exchange mechanism is placed within the chimney or outside the chimney including remotely associating the heat exchange mechanism to the component.

7. An apparatus comprising:
   a data processing device having a heat-emitting component; and
   a chimney coupled to the component to guide an amount of air associated with the component in and out of the chimney; and
   a heat exchange mechanism associated with the component to facilitate sufficient air space to efficiently move about the amount of air within the chimney in accordance with characteristics of the component.

8. The apparatus of claim 7, wherein the chimney is directly or indirectly coupled to the component.

9. The apparatus of claim 7, wherein the chimney includes a duct, and wherein the chimney further includes a fan to assist in guiding the amount of air.

10. The apparatus of claim 7, wherein the component comprises one or more of a processor, a memory, a battery, and a connector.

11. The apparatus of claim 7, wherein the heat exchange mechanism is associated with the component via a heat transportation device, wherein the heat transportation device includes a heat pipe running, via the chimney, from the heat exchange mechanism to the component.

12. The apparatus of claim 11, wherein the heat exchange mechanism is placed within the chimney or outside the chimney including remotely associating the heat exchange mechanism to the component.

13. A system comprising:
   a computer system having a heat-emitting component;
   a chimney coupled to the component to guide an amount of air associated with heat being emitted by the component in and out of the chimney; and
   a heat exchange mechanism associated with the component to facilitate sufficient air space to efficiently move about the amount of air within the chimney in accordance with characteristics of the component.

14. The system of claim 13, wherein the chimney is directly or indirectly coupled to the component.

15. The system of claim 13, wherein the chimney includes a duct,
   and wherein the chimney further includes a fan to assist in guiding the amount of air.

16. The system of claim 13, wherein the component comprises one or more of a processor, a memory, a battery, and a connector.

17. The system of claim 13, wherein the heat exchange mechanism is associated with the component via a heat transportation device, wherein the heat transportation device includes a heat pipe running, via the chimney, from the heat exchange mechanism to the component.

18. The system of claim 17, wherein the heat exchange mechanism is placed within the chimney or outside the chimney including remotely associating the heat exchange mechanism to the component.

* * * * *